(12) United States Patent  
Chen et al.

(10) Patent No.: US 9,136,836 B2
(45) Date of Patent: Sep. 15, 2015

(54) CONVERTER INCLUDING A BOOTSTRAP CIRCUIT AND METHOD

(75) Inventors: Weiyun Chen, Gilbert, AZ (US); Michael A. Stapleton, Scottsdale, AZ (US); Xiaogang Feng, Fremont, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 446 days.

(21) Appl. No.: 13/052,911

(22) Filed: Mar. 21, 2011

(65) Prior Publication Data

US 2012/0242393 A1  Sep. 27, 2012

(51) Int. Cl.
*H03K 17/16* (2006.01)
(52) U.S. Cl.
CPC ...... *H03K 17/165* (2013.01); *H03K 2217/0063* (2013.01)
(58) Field of Classification Search
CPC ........... H01L 2224/00014; H01L 2224/16225; H01L 2224/32225; H01L 2224/48227
See application file for complete search history.

(56) References Cited

U.S. PATENT DOCUMENTS

| | | | |
|---|---|---|---|
| 5,127,352 A * | 7/1992 | Kulpa | 114/144 E |
| 5,426,384 A * | 6/1995 | May | 327/52 |
| 7,378,640 B2 * | 5/2008 | Machida | 250/214 R |
| 8,004,368 B2 * | 8/2011 | Presti et al. | 332/149 |
| 2005/0110556 A1 | 5/2005 | Guedon | |
| 2008/0084243 A1* | 4/2008 | Kanamori et al. | 327/589 |
| 2008/0290911 A1 | 11/2008 | Williams | |
| 2008/0303580 A1 | 12/2008 | Stegmayr | |
| 2009/0010035 A1 | 1/2009 | Williams | |
| 2010/0019807 A1 | 1/2010 | Zhang et al. | |
| 2010/0201443 A1* | 8/2010 | Kaya et al. | 330/251 |
| 2010/0259238 A1 | 10/2010 | Cheng | |
| 2011/0018593 A1 | 1/2011 | Williams | |

* cited by examiner

*Primary Examiner* — Sibin Chen
(74) *Attorney, Agent, or Firm* — Rennie William Dover

(57) ABSTRACT

In accordance with an embodiment, a converter includes a circuit and method for charging a bootstrap capacitor. The circuit monitors a voltage across the bootstrap capacitor and enables charging the bootstrap capacitor in response to the voltage across the bootstrap capacitor being less than a threshold voltage.

20 Claims, 2 Drawing Sheets

CONVERTER INCLUDING A BOOTSTRAP CIRCUIT AND METHOD

BACKGROUND

The present invention relates, in general, to electronics and, more particularly, to methods of forming semiconductor devices and structure.

In the past, the semiconductor industry used power supplies that maintained a constant Direct Current (DC) output voltage even though the load current or the input voltage may have changed. For switching power supplies, this has led to switching and efficiency losses when operating at low and high load currents. For example, a switching power supply may include a driver circuit that drives a high side transistor and a low side transistor in which the source terminal of the high side transistor is connected to the drain terminal of the low side transistor. The source terminal of the low side transistor may be coupled for receiving a source of operating potential such as, for example, a voltage $V_{SS}$. In this configuration the node formed by the connection of the source of the high side transistor to the drain of the low side transistor is at a floating potential. To stabilize the output voltage of the converter under different loads, a bootstrap circuit may be included to help drive the high side transistor. Bootstrap circuitry suitable for use in a converter has been disclosed in U.S. Patent Application Publication No. 2010/0259238 A1 filed by Chieh-Wen Cheng and published on Oct. 14, 2010, and in U.S. Patent Application Publication No. 2005/0110556 A1 filed by Yannick Guedon and published on May 26, 2005. A drawback with these techniques is that the bootstrap circuits include a capacitor that contains charge that slowly decays through parasitic leakage paths.

Accordingly, it would be advantageous to have a method and circuit suitable for driving a high side transistor. It would be of further advantage for the method and circuit to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
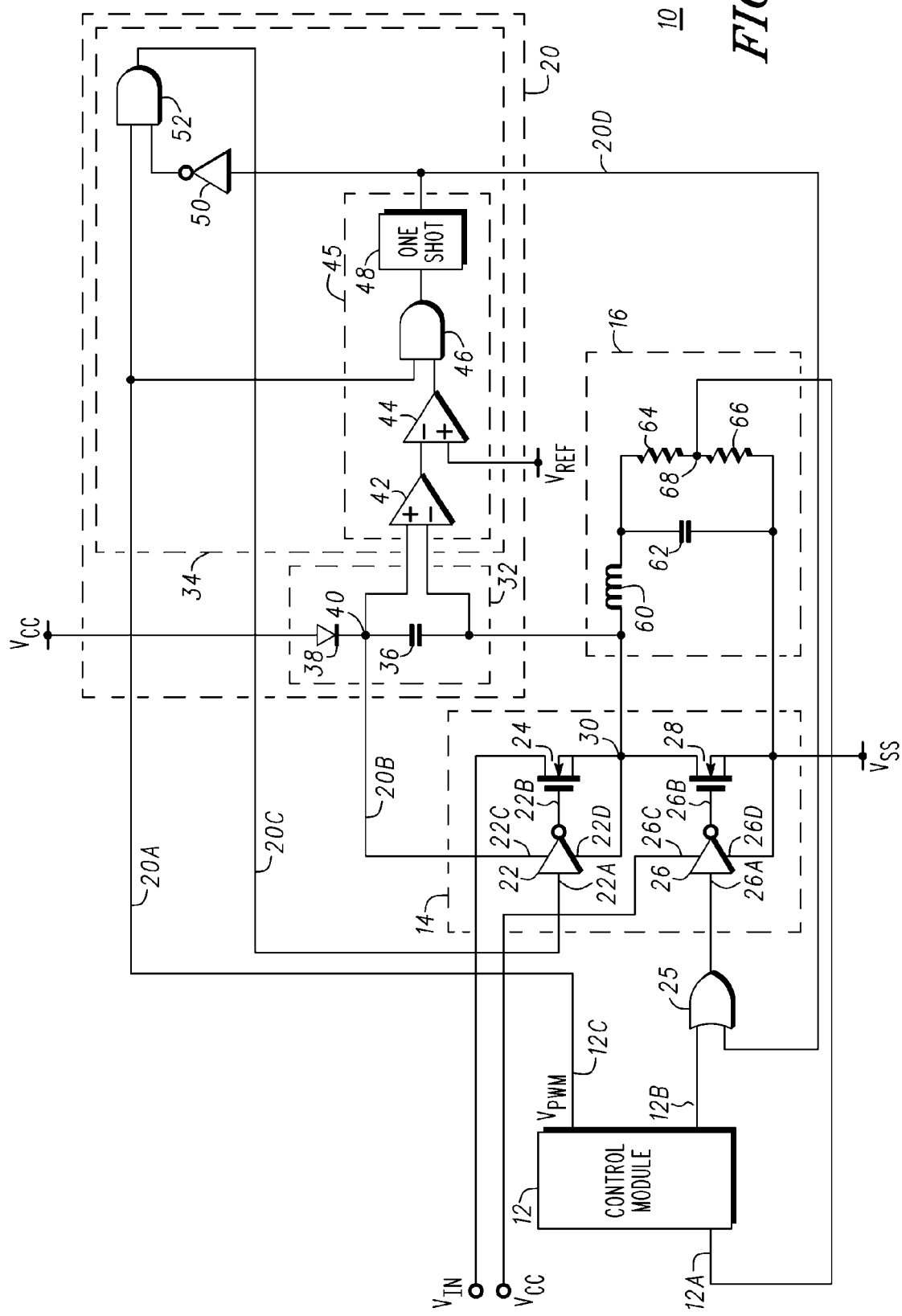
FIG. 1 is a circuit schematic of a converter in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally the present invention provides a converter having a bootstrap circuit and a method for starting a converter. In accordance with an embodiment, a converter is provided that includes a pair of transistors configured as high side and low side transistors in which the source terminal of the high side transistor is connected to the drain terminal of the low side transistor. A bootstrap circuit is coupled to the high and low side transistors and includes a sense circuit and a logic circuit. By way of example, the sense circuit includes an amplifier, a comparator, an AND gate, and a pulse generation element. In accordance with another embodiment, the sense circuit includes an amplifier, a comparator with hysteresis, and an AND gate.

In accordance with another embodiment, the sense circuit senses a signal across an energy storage element to generate a sense signal. In response to the sense signal being less than a reference level, the low side transistor is turned on and the high side transistor is maintained in an off state. Turning on the low side transistor charges the charge storage element, which may be used to turn on the high side transistor.

FIG. 1 is a circuit schematic of a DC to DC converter 10 in accordance with an embodiment of the present invention. DC to DC converter 10 includes a control module 12 coupled to an output stage 16 through a drive circuit 14 and a bootstrap circuit 20 connected to control module 12 and to drive circuit 14. More particularly, drive circuit 14 is comprised of a driver device 22 connected to a switching device 24 and a driver device 26 connected to a switching device 28. Driver device 22 has an input terminal 22A, an output terminal 22B, an upper supply terminal 22C, and a lower supply terminal 22D and driver device 26 has an input terminal 26A, an output terminal 26B, an upper supply terminal 26C, and a lower supply terminal 26D. Control module 12 has an input terminal 12A and output terminals 12B and 12C and bootstrap circuit 20 has an input terminal 20A and output terminals 20B, 20C, and 20D. Output terminal 20C of bootstrap circuit 20 is connected to input terminal 22A of driver device 22. DC to DC converter 10 further includes, for example, a two input OR gate 25 having an input terminal connected to output terminal 12B of control module 12, an input terminal connected to output terminal 20D of bootstrap circuit 20, and an output terminal connected to input terminal 26A of driver device 26. Output terminal 12C of control module 12 is connected to input terminal 20A of bootstrap circuit 20 for transmitting a pulse width modulation signal $V_{PWM}$ to bootstrap circuit 20.

Switching devices 24 and 28 may be field effect transistors such as, for example, Metal Oxide Semiconductor Field Effect Transistors (MOSFETs) or the like, where each device has a control electrode and current carrying electrodes. In accordance with an embodiment in which switching devices 24 and 28 are power MOSFETs, the control electrode is a gate electrode or terminal, one of the current carrying electrodes is a drain electrode or terminal, and the other current carrying electrode is a source electrode or terminal. Thus, output terminal 22B of driver device 22 is connected to the gate terminal of power MOSFET 24 and output terminal 26B of driver device 26 is connected to the gate terminal of power MOSFET 28. The drain terminal of power MOSFET 24 is coupled for receiving an input voltage $V_{IN}$ and the source terminal of power MOSFET 24 is connected to the drain terminal of power MOSFET 28 to form a switching node 30. The source terminal of power MOSFET 28 is coupled for receiving a source of operating potential $V_{SS}$. Operating potential $V_{SS}$ may be, for example, a ground potential. Upper supply terminal 22C is connected to bootstrap circuit 20 as further described below and lower supply terminal 22D is connected to switching node 30. Upper supply terminal 26C of driver device 26 is coupled for receiving a source of operating potential $V_{CC}$ and lower supply terminal 26D is coupled for receiving operating potential $V_{SS}$.

Bootstrap circuit 20 is comprised of a voltage generation section 32 coupled to a charge adjustment section 34. By way of example, voltage generation section 32 is comprised of a bootstrap capacitor 36 and a bootstrap diode 38. Bootstrap capacitor 36 may be referred to as an energy storage element and has a terminal connected to switching node 30 and a terminal connected to upper supply terminal 22C of driver device 22 and to the cathode of bootstrap diode 38, and to charge adjustment section 34 to form a supply node 40, which may serve as output terminal 20B. The anode of bootstrap diode 38 is coupled for receiving source of operating potential $V_{CC}$. In accordance with an embodiment, charge adjustment section 34 is comprised of an amplifier 42 connected to a comparator 44, where amplifier 42 has an inverting input terminal connected to switching node 30, a noninverting input terminal connected to supply node 40, and an output terminal. Comparator 44 has a noninverting input terminal coupled for receiving a reference voltage $V_{REF}$, an inverting input terminal connected to the output terminal of amplifier 42, and an output terminal. In addition, charge adjustment section 34 may include a logic gate such as, for example, a two-input AND gate 46 having an input terminal connected to the output terminal of comparator 44, and an input terminal coupled for receiving a pulse width modulation signal $V_{PWM}$ via input terminal 20A. The output terminal of AND gate 46 is coupled to two-input AND gate 52 through a pulse generator 48 and a logic gate 50. It should be noted that amplifier 42, comparator 44, AND gate 46, and pulse generator 48 cooperate to form a sense circuit 45. By way of example, pulse generator 48 is a one shot and logic gate 50 is an inverter. More particularly, an input terminal of one shot 48 is connected to the output terminal of AND gate 46, an output terminal of one shot 48 is connected to an input terminal of inverter 50, and an output terminal of inverter 50 is connected to an input terminal of AND gate 52. The other input terminal of AND gate 52 is connected for receiving pulse width modulation signal $V_{PWM}$ via input terminal 20A of bootstrap circuit 20 and output terminal 12C of control module 12. The output terminal of one shot 48 may serve as output terminal 20D of bootstrap circuit 12 and is coupled to input terminal 26A of driver device 26 through OR gate 25. The output terminal of AND gate 52 may serve as output terminal 20C of bootstrap circuit 20.

By way of example, output stage 16 is comprised of an inductor 60 having a terminal connected to switching node 30 and a terminal connected to terminals of an output capacitor 62 and to a terminal of an output resistor 64. The other terminal of output capacitor 62 is coupled for receiving source of operating voltage $V_{SS}$. The other terminal of output resistor 64 is connected to another output resistor 66, where output resistor 66 has a terminal connected to output resistor 64 to form a feedback node 68 and a terminal coupled for receiving source of operating potential $V_{SS}$. Feedback node 68 is connected to input terminal 12A of control module 12.

In response to a light load or switching power MOSFETs 24 and 28 being off, parasitic leakage currents may discharge boost capacitor 36. Bootstrap circuit 20 senses the voltage across bootstrap capacitor 36. More particularly, sense amplifier 42 monitors the voltage across bootstrap capacitor 36 and in response to the voltage at the output terminal of amplifier 42 being less than a level of reference voltage $V_{REF}$ comparator 44 generates a logic high voltage at its output, which causes AND gate 46 to generate a pulse width modulated signal at its output terminal. It should be noted that when the voltage at the output terminal of amplifier 42 is less than reference voltage $V_{REF}$, the voltage across bootstrap capacitor 36 is too low to turn on switching power MOSFET 24. The voltage at the output terminal of sense amplifier 42 may be referred to as a sense signal or a sense voltage. In response to the pulse width modulation signal $V_{PWM}$ at one of its input terminals and the logic high voltage level at the other of its input terminals, AND gate 46 causes one shot 48 to generate an output pulse that turns on switching power MOSFET 28 for a predetermined amount of time and maintains switching power MOSFET 24 in an off state. In response to being on, a drain-to-source current flows through switching power MOSFET 28 and charges bootstrap capacitor 36.

Sense amplifier 42 continues to monitor the voltage across bootstrap capacitor 36 and if the voltage at the output terminal of amplifier 42 is still less than reference voltage $V_{REF}$, i.e., the voltage across bootstrap capacitor 36 is still too low to turn on switching power MOSFET 24, comparator 44 generates a logic high voltage at its output, which causes AND gate 46 to generate a pulse width modulated signal at its output terminal. In response to the pulse width modulation signal $V_{PWM}$ at one of its input terminals and the logic high voltage level at the other of its input terminals, AND gate 46 causes one shot 48 to generate another output pulse that turns on switching power MOSFET 28 for a predetermined amount of time and maintains switching power MOSFET 24 in an off state. In response to being on, a drain-to-source current flows through switching power MOSFET 28 and further charges bootstrap capacitor 36. This process continues in response to the voltage across bootstrap capacitor 36 being too low to turn on switching power MOSFET 24. Thus, in response to the voltage across bootstrap capacitor 36 being too low to turn on switching power MOSFET 24, bootstrap circuit 20 generates signals that are used by control module 12 to turn on switching power MOSFET 28 and to maintain switching power MOSFET 24 in an off state. Turning on switching power MOSFET 28 provides a current path for charging bootstrap capacitor 36.

In response to the voltage at the output terminal of amplifier 42 being greater than reference voltage $V_{REF}$, comparator 44 generates a logic low voltage at its output terminal, which causes AND gate 46 to generate a logic low voltage at its output terminal. This occurs because the voltage across bootstrap capacitor 36 is sufficient to turn on switching power MOSFET 24. In response to the logic low voltage level at the output terminal of AND gate 46, control module 12 generates a control signal that turns off switching power MOSFET 28. In addition, the logic low voltage level at the output terminal of AND gate 46 causes the input signal at one of the input terminals of AND gate 52 to be at a logic high voltage level. In response to the logic high voltage level at one of the input terminals of AND gate 52 and pulse width modulation signal $V_{PWM}$ at the other input terminal of AND gate 52, AND gate 52 generates a control signal that turns on and off switching power MOSFET 24. Thus, in response to bootstrap capacitor 36 having sufficient charge to turn on switching power MOSFET 24, converter 10 enters the active operating mode in which switching power MOSFETs 24 and 28 are controlled by control module 12 and bootstrap circuit 20 enters a quiescent state in which it transfers control of switching power MOSFETs 24 and 28 to control module 12 and load circuit 16.

Figure 2:
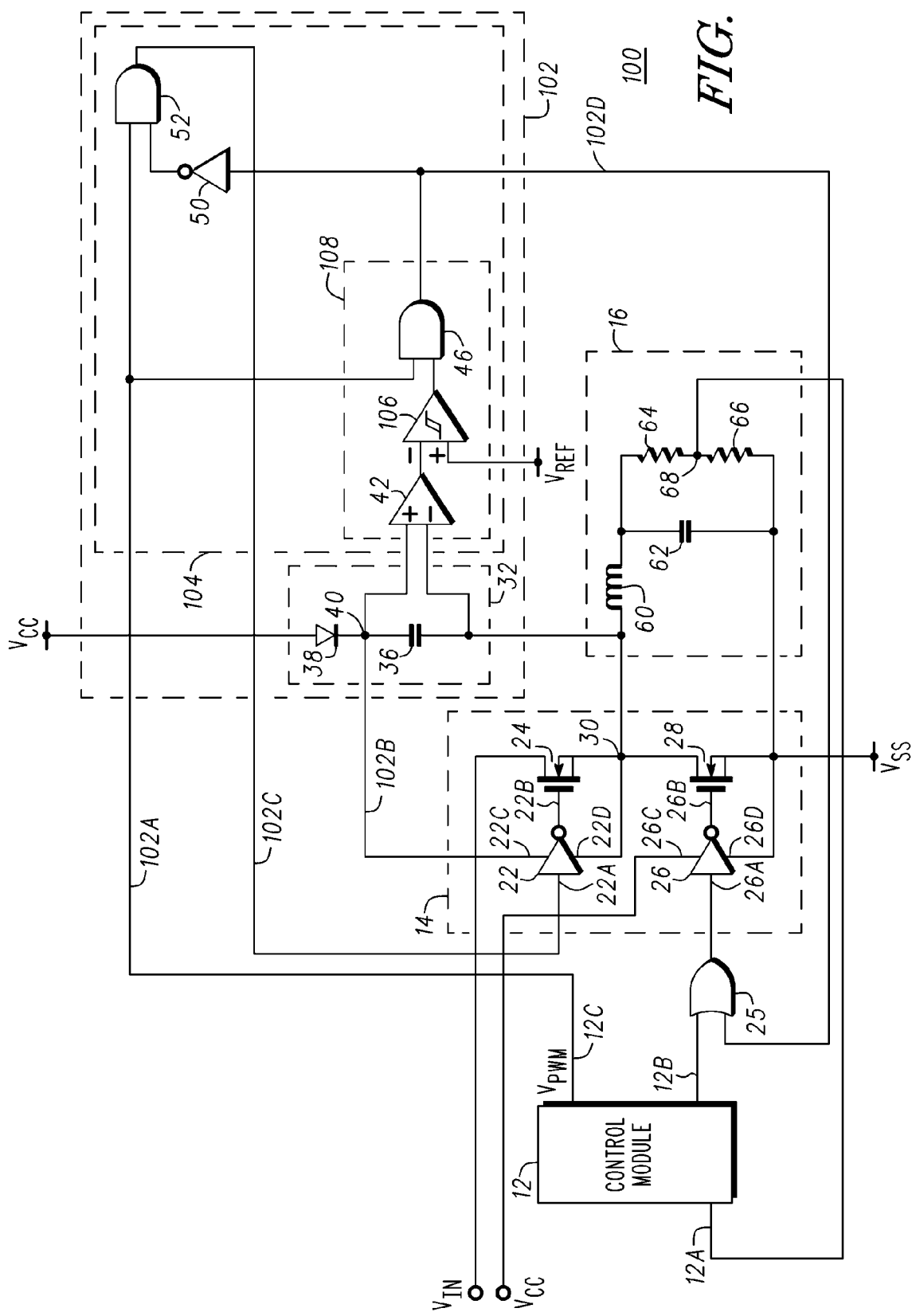
FIG. 2 is circuit schematic of a converter in accordance with another embodiment of the present invention.

FIG. 2 is a circuit schematic of a DC to DC converter 100 in accordance with another embodiment of the present invention. DC to DC converter 100 is similar to DC to DC converter 10 except that comparator 44 is replaced by a comparator with hysteresis 106 and one shot 48 is absent. The comparator 106 with hysteresis is referred to as a hysteretic comparator. Accordingly, DC to DC converter 100 includes control module 12 coupled to output stage 16 through driver circuit 14. Control module 12, driver stage 14, and output stage 16 have been described with reference to FIG. 1. A bootstrap circuit 102 is connected to control module 12 and to drive circuit 14. It should be noted that output terminal 12C of control module 12 of DC to DC converter 100 is connected to an input terminal 102A of bootstrap circuit 102. Bootstrap circuit 102 is comprised of voltage generation section 32 coupled to a charge adjustment section 104. By way of example, voltage generation section 32 is comprised of a bootstrap capacitor 36 and a bootstrap diode 38. Bootstrap capacitor 36 has a terminal connected to switching node 30 and a terminal connected to upper supply terminal 22C of driver device 22 and to the cathode of bootstrap diode 38, and to charge adjustment section 34 to form a supply node 40, which may serve as output terminal 102B of bootstrap circuit 102. The anode of bootstrap diode 38 is coupled for receiving a source of operating potential $V_{CC}$. In accordance with an embodiment, charge adjustment section 104 is comprised of an amplifier 42 connected to a hysteretic comparator 106, where amplifier 42 has an inverting input terminal connected to switching node 30, a noninverting input terminal connected to supply node 40, and an output terminal. Hysteretic comparator 106 has a noninverting input terminal coupled for receiving a reference voltage $V_{REF}$, an inverting input terminal connected to the output terminal of amplifier 42, and an output terminal. In addition, charge adjustment section 104 may include AND gate 46 having an input terminal connected to the output terminal of hysteretic comparator 106 and an input terminal coupled for receiving a pulse width modulation signal $V_{PWM}$ via output terminal 12C of control module 12. It should be noted that amplifier 42, hysteretic comparator 106, and AND gate 46 cooperate to form a sense circuit 108. The output terminal of AND gate 46 is connected to a AND gate 52 through inverter 50. More particularly, the output terminal of AND gate 46 is connected to the input terminal of inverter 50 and the output terminal of inverter 50 is connected to an input terminal of AND gate 52. The other input terminal of AND gate 52 may serve as input terminal 102A of bootstrap circuit 102 and is connected to output terminal 12C of control module 12 for receiving pulse width modulation signal $V_{PWM}$. The output terminal of AND gate 46 is coupled to input terminal 26A of driver device 26 through, for example, OR gate 25 and the output terminal of AND gate 52 is connected to input terminal 22A of driver device 22. The output terminals of AND gates 46 and 52 may serve as output terminals 102D and 102C, respectively, of bootstrap circuit 102.

In response to a light load or switching power MOSFETs 24 and 28 being off, parasitic leakage currents may discharge bootstrap capacitor 36. Bootstrap circuit 20 senses the voltage across bootstrap capacitor 36. More particularly, sense amplifier 42 monitors the voltage across bootstrap capacitor 36 and in response to the voltage at the output terminal of amplifier 42 being less than reference voltage $V_{REF}$ hysteretic comparator 106 generates a logic high voltage at its output, which causes AND gate 46 to generate a pulse width modulated signal at its output terminal. It should be noted that in response to the voltage at the output terminal of amplifier 42 being less than reference voltage $V_{REF}$, the voltage across bootstrap capacitor 36 is too low to turn on switching power MOSFET 24. The voltage at the output terminal of sense amplifier 42 may be referred to as a sense signal or a sense voltage. In response to the sense signal and reference voltage $V_{REF}$, hysteresis comparator 106 generates an output pulse that, in cooperation with pulse width modulation signal $V_{PWM}$, turn on switching power MOSFET 28 for a predetermined amount of time and maintains switching power MOSFET 24 in an off state. In response to being on, a drain-to-source current flows through switching power MOSFET 28 and charges bootstrap capacitor 36.

Sense amplifier 42 continues to monitor the voltage across bootstrap capacitor 36 and if the voltage at the output terminal of amplifier 42 is still less than reference voltage $V_{REF}$, i.e., the voltage across bootstrap capacitor 36 is still too low to turn on switching power MOSFET 24, hysteretic comparator 106 generates an output pulse that, in cooperation with pulse width modulation signal $V_{PWM}$, turns on switching power MOSFET 28 for a predetermined amount of time and maintains switching power MOSFET 24 in an off state. In response to being on, a drain-to-source current flows through switching power MOSFET 28 and further charges bootstrap capacitor 36. This process continues in response to the voltage across bootstrap capacitor 36 being too low to turn on switching power MOSFET 24. Thus, in response to the voltage across bootstrap capacitor 36 being too low to turn on switching power MOSFET 24, bootstrap circuit 20 generates signals that are used by control module 12 to turn on switching power MOSFET 28 and to maintain switching power MOSFET 24 in an off state. Turning on switching power MOSFET 28 provides a current path for charging bootstrap capacitor 36.

In response to the voltage at the output terminal of amplifier 42 being greater than reference voltage $V_{REF}$, hysteretic comparator 106 generates a logic low voltage at its output terminal, which causes AND gate 46 to generate a logic low voltage level at its output terminal. This occurs because the voltage across bootstrap capacitor 36 is sufficient to turn on switching power MOSFET 24. In response to the logic low voltage level at the output terminal of AND gate 46, control module 12 generates a control signal that turns off switching power MOSFET 28. In addition, the logic low voltage level at the output terminal of AND gate 46 causes the input signal at one of the input terminals of AND gate 52 to be at a logic high voltage level. In response to the logic high voltage level at one of the input terminals of AND gate 52 and the pulse width modulation signal $V_{PWM}$ at the other input terminal of AND gate 52, AND gate 52 generates a control signal that turns on and off switching power MOSFET 24. Thus, in response to bootstrap capacitor 36 having sufficient charge to turn on switching power MOSFET 24, converter 10 enters the active operating mode in which switching power MOSFETs 24 and 28 are controlled by control module 12 and bootstrap circuit 20 enters a quiescent state in which it transfers control of switching power MOSFETs 24 and 28 to control module 12 and load circuit 16.

By now it should be appreciated that a bootstrap circuit and a method for starting a converter have been provided. In accordance with embodiments of the present invention, the bootstrap circuit turns on the low side MOSFET 28 and maintains high side MOSFET 24 in an off state allowing bootstrap capacitor 36 to become sufficiently charged to turn on high side MOSFET 24. Bootstrap circuits such as, for example circuits 20 and 102 maintain a high efficiency in applications having light loads such as portable applications, notebooks, mobile devices, or the like, and in applications in which the switching frequency may be as low as several Hertz. In addition, bootstrap circuits 20 and 102 are useful in high output voltage applications where a low impedance charge path for a bootstrap capacitor is absent.

Although specific embodiments have been disclosed herein, it is not intended that the invention be limited to the disclosed embodiments. Those skilled in the art will recognize that modifications and variations can be made without departing from the scope of the invention. It is intended that the invention encompass all such modifications and variations as fall within the scope of the appended claims.

What is claimed is:

1. A bootstrap circuit suitable for use in a converter, comprising:
    a low side transistor having a control terminal and first and second current carrying terminals;
    a high side transistor having a control terminal and first and second current carrying terminals, the first current carrying terminal of the high side transistor coupled to the second current carrying terminal of the low side transistor to form a node;
    a sense circuit having first, second, third, and fourth input terminals and an output terminal, the first input terminal of the sense circuit coupled to the node and the output terminal of the sense circuit configured to drive the control terminal of the low side transistor;
    an energy storage element having a first terminal and a second terminal, the first terminal of the energy storage element directly connected to the first input terminal of the sense circuit and the second terminal of the energy storage element directly connected to the second input terminal of the sense circuit; and
    a first logic gate having first and second input terminals and an output terminal, the first input terminal of the first logic gate coupled to the output terminal of the sense circuit, the second input terminal of the first logic gate coupled to the fourth input terminal of the sense circuit, and the output terminal of the first logic gate coupled to the control terminal of the high side transistor.

2. The bootstrap circuit of claim 1, wherein the sense circuit comprises:
    an amplifier having first and second input terminals and an output terminal, wherein the first and second input terminals of the amplifier serve as the first and second input terminals of the sense circuit;
    a comparator having first and second input terminals and an output terminal, the first input terminal of the comparator coupled to the output terminal of the amplifier and the second input terminal of the comparator serving as the third input terminal of the sense circuit;
    a second logic gate having first and second input terminals and an output terminal, the first input terminal of the second logic gate coupled to the output terminal of the comparator; and
    a pulse generator having an input terminal and an output terminal, the input terminal of the pulse generator coupled to the output terminal of the second logic gate.

3. The bootstrap circuit of claim 2, wherein the second input terminal of the comparator is coupled for receiving a reference voltage.

4. The bootstrap circuit of claim 3, further including a third logic gate having an input terminal and an output terminal, the input terminal of the third logic gate coupled to the output terminal of the pulse generator and the output terminal of the third logic gate coupled to the first input terminal of the first logic gate.

5. The bootstrap circuit of claim 2, wherein the pulse generator comprises a one shot.

6. The bootstrap circuit of claim 1, further including a second logic gate having an input terminal and an output terminal, the input terminal of the second logic gate coupled to the output terminal of the sense circuit and the output terminal of the second logic gate coupled to the first input terminal of the first logic gate.

7. A converter comprising:
    first and second transistors, each transistor of the first and second transistors having a control electrode and first and second current carrying electrodes, wherein the second current carrying electrode of the first transistor is directly coupled to the first current carrying electrode of the second transistor to form a node;
    a bootstrap circuit comprising:
        a sense circuit having first, second, third, and fourth input terminals and an output terminal, the first input terminal coupled to the node, the output terminal of the sense circuit coupled to the control terminal of the first transistor; and
        a first logic gate having first and second input terminals and an output terminal, the first input terminal of the first logic gate coupled to the output terminal of the sense circuit, the output terminal of the first logic gate coupled to the control terminal of the second transistor; and
    an energy storage element having a first terminal and a second terminal, the first terminal of the energy storage element directly connected to the first input terminal of the sense circuit and the second terminal of the energy storage element directly connected to the second input terminal of the sense circuit.

8. The converter of claim 7, wherein the sense circuit comprises:
    a sense amplifier having first and second input terminals and an output terminal;
    a comparator having first and second input terminals and an output terminal, the first input terminal of the comparator coupled to the output terminal of the sense amplifier;

a second logic gate having first and second input terminals and an output terminal, the first input terminal of the second logic circuit coupled to the output terminal of the comparator; and a one shot having an input terminal and an output terminal, the input terminal coupled to the output terminal of the second logic gate and the output terminal of the one shot serving as the output terminal of the sense circuit.

9. A converter comprising:

first and second transistors, each transistor of the first and second transistors having a control electrode and first and second current carrying electrodes, wherein the second current carrying electrode of the first transistor is coupled to the first current carrying electrode of the second transistor to form a first node; and a bootstrap circuit comprising:

a sense circuit having first, second, third, and fourth input terminals and an output terminal, the first input terminal coupled to the node, wherein the sense circuit comprises:

a sense amplifier having first and second input terminals and an output terminal;

a comparator having first and second input terminals and an output terminal, the first input terminal of the comparator coupled to the output terminal of the sense amplifier;

a second logic gate having first and second input terminals and an output terminal, the first input terminal of the second logic circuit coupled to the output terminal of the comparator; and a one shot having an input terminal and an output terminal, the input terminal coupled to the output terminal of the second logic gate and the output terminal of the one shot serving as the output terminal of the sense circuit; and a first logic gate having first and second input terminals and an output terminal, the first input terminal of the first logic gate coupled to the output terminal of the sense circuit; and an inverter coupled between the output terminal of the sense circuit and the first input terminal of the first logic gate.

10. The converter of claim 9, wherein the first logic gate and the second logic gate are AND gates.

11. The converter of claim 9, wherein the output terminal of the sense circuit is coupled to the control electrode of the second transistor.

12. The converter of claim 11, further including:

a third logic gate having a first input and a second input, the first input of the third logic gate coupled to the output of the sense circuit; and an inverter having an input and an output, the input of the inverter coupled to the output of the third logic gate and the output of the inverter coupled to the control electrode of the third logic gate.

13. The converter of claim 12, wherein the third logic gate is an OR gate.

14. The converter of claim 9, further including a capacitor having first and second terminals, wherein the first terminal of the capacitor is coupled to the first input terminal of the sense circuit and the second terminal of the capacitor is coupled to the second input terminal of the sense circuit.

15. The converter of claim 14, wherein the output terminal of the first logic gate is coupled to the control electrode of the first transistor.

16. A method for operating a converter, comprising:

providing first and second transistors and an energy storage element, the first transistor having a control electrode and first and second current carrying electrodes and the second transistor having a control electrode and first and second current carrying electrodes, wherein the second current carrying electrode of the first transistor is directly coupled to the first current carrying electrode of the second transistor at a switching node, the energy storage element having a first terminal and a second terminal, the first terminal of the energy storage element directly connected to the switching node;

providing a bootstrap circuit comprising:

a sense circuit having first, second, third, and fourth input terminals and an output terminal, the first input terminal of the sense circuit directly coupled to the switching node and to the first terminal of the energy storage element, the second terminal of the sense circuit connected to the second terminal of the energy storage element, and the output terminal of the sense circuit coupled to the control electrode of the first transistor; and a first logic gate having first and second input terminals and an output terminal, the first input terminal of the first logic gate coupled to the output terminal of the sense circuit and the output terminal of the first logic gate coupled to the control electrode of the second transistor;

sensing a signal across the energy storage element to generate a sense signal, the signal across the energy storage element at the first and second input terminals of the sense circuit; and in response to the sense signal being less than a reference level, turning on the second transistor and holding the first transistor in an off state, wherein a current flowing through the second transistor charges the energy storage element.

17. The method of claim 16, wherein sensing the signal across the energy storage element comprises sensing a voltage across a capacitor.

18. The method of claim 16, wherein turning on the second transistor includes turning the second transistor on for a predetermined amount of time.

19. The method of claim 16, wherein turning on the second transistor includes turning on the second transistor in response to a pulse width modulation signal.

20. The method of claim 16, further including turning on, the first transistor in response to the sense signal being greater than the reference level.

* * * * *